United States Patent
Allman et al.

[19]

[11] Patent Number: 5,963,828
[45] Date of Patent: Oct. 5, 1999

[54] METHOD FOR TUNGSTEN NUCLEATION FROM WF$_6$ USING TITANIUM AS A REDUCING AGENT

[75] Inventors: Derryl D.J. Allman; Verne C. Hornback, both of Colorado Springs, Colo.; Ramanath Ganapathiraman, Urbana; Leslie H. Allen, Champaign, both of Ill.

[73] Assignee: LSI Logic Corporation, Milpitas, Calif.

[21] Appl. No.: 08/773,471

[22] Filed: Dec. 23, 1996

[51] Int. Cl.$^6$ ................................... H01L 21/441
[52] U.S. Cl. .................. 438/648; 438/657; 438/685; 438/680; 438/768
[58] Field of Search ................ 438/648, 653, 438/654, 656, 643, 661, 765, 768, 657, 685, 680

[56] References Cited

U.S. PATENT DOCUMENTS

| | | | |
|---|---|---|---|
| 4,926,237 | 5/1990 | Sun et al. | 357/71 |
| 5,250,467 | 10/1993 | Somekk et al. | 438/643 |
| 5,317,187 | 5/1994 | Hindman et al. | 257/659 |
| 5,434,451 | 7/1995 | Dalal et al. | 257/768 |
| 5,514,622 | 5/1996 | Bornstein et al. | 437/189 |
| 5,534,463 | 7/1996 | Lee et al. | 437/195 |
| 5,552,339 | 9/1996 | Hsieh | 438/643 |
| 5,565,708 | 10/1996 | Ohsaki et al. | 257/764 |

FOREIGN PATENT DOCUMENTS

| | | | |
|---|---|---|---|
| 0651436 | 5/1995 | European Pat. Off. | H01L 21/3205 |
| 2217469 | 8/1990 | Japan | C23C 16/00 |
| 4120725 | 4/1992 | Japan | H01L 21/28 |

OTHER PUBLICATIONS

Rana, V.V.S., et al. "Thin Layers of TiN and Al as glue layers for blanket tungsten deposition" *Tungsten* and Other Refractory Metals for VLSI, Proc. pp. 187–195 (abstract), 1986.

Broadbent, E.K., et al. "Growth of selective tungsten on self–aligned Ti . . . " J. Electrochem. Soc. Mp. 1715–21 vol. 133, No. 8, (abstract), Aug. 1986.

Smith, G.C., et al. "Comparison of two Contact plug techniques . . . " 1986 Proc. Third International IEEE VLSI Multilevel Interconnect. Conf. pp. 403–410(abstract), Jun. 1986.

Hidekazu Okuhira et al. "Patterned Chemical Vapor Deposition of Tungsten Films on Silicon Dioxide", Japanese Journal of Applied Physics, Supplements; pp. 231–234, XP000178044; Jan. 1, 1990.

E.K. Broadbent et al., "Selective Tungsten Processing by Low Pressure CVD", Solid State Technology, vol. 28, No. 12, Dec. 1985, N.Y., USA, pp. 51–59, XP002059131.

*Primary Examiner*—Caridad Everhart
*Attorney, Agent, or Firm*—Wayne P. Bailey; Duke W. Yee

[57] ABSTRACT

A method in a semiconductor process for forming a layer of a selected compound on a substrate of a semiconductor device. A layer of titanium is formed on the substrate as a sacrificial layer. The layer of titanium is reduced using a gaseous form of a fluorine containing compound in which the fluorine containing compound includes the selected compound that is to be formed on the substrate of the semiconductor device.

29 Claims, 3 Drawing Sheets

METHOD FOR TUNGSTEN NUCLEATION FROM WF₆ USING TITANIUM AS A REDUCING AGENT

BACKGROUND OF THE INVENTION

1. Technical Field

The present invention relates generally to semiconductor devices and in particular to a process for manufacturing semiconductor devices. Still more particularly, the present invention relates to an improved method for forming tungsten plugs.

2. Description of the Related Art

The fabrication of semiconductor devices include processes that frequently require the deposition of thin layers onto the semiconductor surface. This deposition can be achieved by sputtering, but another important process for deposition of materials is chemical vapor deposition (CVD), which is regularly used for silicon dioxide, silicon nitride, and polycrystalline silicon (polysilicon). Basically, a material is reacted at a high temperature and is deposited on the surface of the semiconductor with the aid of a carrier gas. Vapor phase epitaxial techniques are a good example of this process. Deposition often takes place at low pressures. Improved film quality, however, can be obtained by allowing the reaction to take place at low pressures in what is known as a low pressure CVD (LPCVD) reactor. Chemical vapor deposition is not confined to polysilicon, silicon oxide, and silicon nitride. Other materials such as tungsten and tungsten silicide ($WSi_2$) among others have been deposited using chemical vapor deposition.

Tungsten chemical vapor deposition (CVD) plugs are typically deposited by the reduction of $WF_6$ by gaseous reducing agents such as silane ($SiH_4$) and hydrogen gas ($H_2$) are commonly used for vertically connecting adjacent layers of aluminum in sub 1.0 μm applications. Tungsten is typically deposited on a titanium nitride (TiN)/titanium (Ti) liner in which the TiN layer acts as a diffusion barrier to prevent $WF_6$ from reacting with the underlying layers. Titanium getters the interfacial impurities such as oxygen from the surface of the underlayers such as aluminum and silicon and reduces contact and via resistance. On other substrates such as silicon or silicon oxide, titanium also serves as an adhesion promotor for overlayers by forming a thin $TiSi_2$ on silicon and $TiO_xSi_y$ on silicon oxide layer.

Delamination of sputter-deposited TiN/Ti liners during the early stages of tungsten CVD is a major defect issue during semiconductor device processing. The delamination causes the formation of volcano-like defects that cause metal bridging or open metal lines, which often leads to device failure. $WF_6$ diffuses through intercolumnar voids in the TiN layer and reacts with the underlying Ti layer during tungsten CVD. The resulting accumulation of large quantities of fluorine in the titanium underlayer interacts with the $Ti/SiO_2$ interface, causing adhesion failure. Basically, fluorine diffuses through the bilayer of TiN and/Ti during the reduction of $WF_6$ by $SiH_4$ and $_2H$ . The nucleation of tungsten using $SiH_4$, and $H_2$ or both is too slow to provide adequate protection from fluorine diffusion, depending on the structure of the TiN film.

Therefore, it would be advantageous to have an improved method for depositing tungsten on a semiconductor device.

SUMMARY OF THE INVENTION

The present invention provides a method in a semiconductor process for forming a layer of a selected compound on a substrate of a semiconductor device. A layer of titanium is formed on the substrate as a sacrificial layer. The layer of titanium is reduced using a gaseous form of a fluorine containing compound in which the fluorine containing compound includes the selected compound that is to be formed on the substrate of the semiconductor device.

An example of a fluorine containing compound is $WF_6$, which reduces a titanium layer to form a layer of tungsten on the substrate of the semiconductor device. The reducing process is typically performed in a chemical vapor deposition chamber.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

The present invention provides a process for creating semiconductor devices in which a sacrificial layer of titanium on a substrate is reduced by a fluorine containing compound ($RF_x$), which contains a selected compound (R) for deposition on the substrate. The general equation for this reaction is:

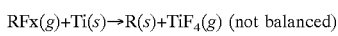

$RFx(g)+Ti(s)\rightarrow R(s)+TiF_4(g)$ (not balanced)

Figure 1A:
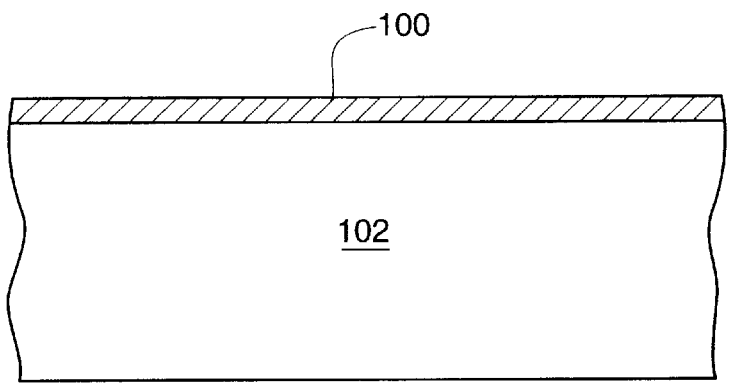
FIGS. 1A–1C depicts a process for depositing a selected compound on a substrate in accordance with a preferred embodiment of the present invention.
Figure 1B:
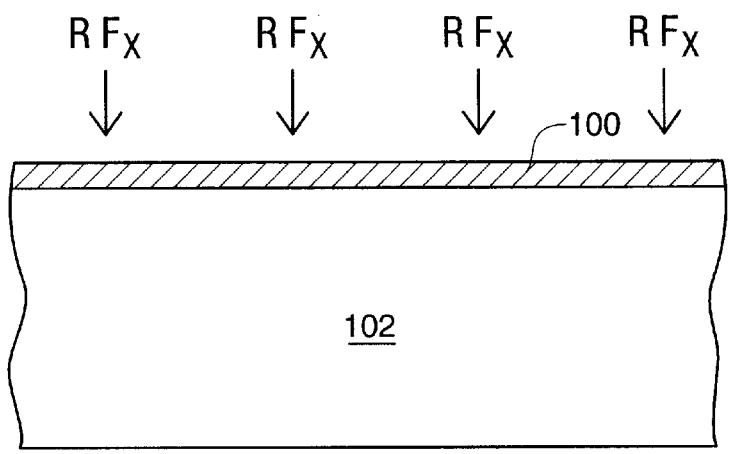
Figure 1C:
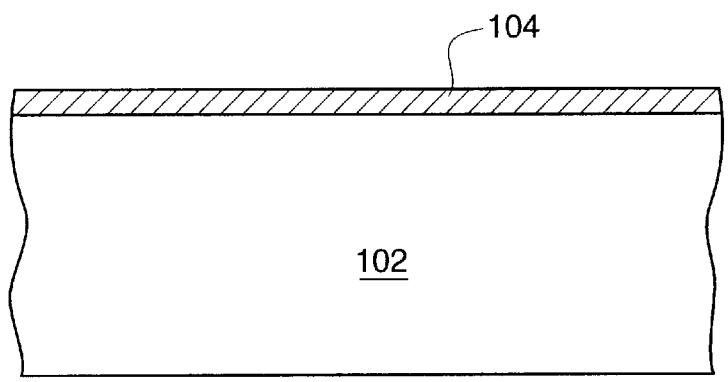

With reference now to the figures, and in particular with reference to FIGS. 1A–1C, a process for depositing a selected compound on a substrate is depicted in accordance with a preferred embodiment of the present invention. In FIG. 1A, a titanium layer 100 is deposited on a substrate 102. Ti is typically deposited using a magnetron sputter deposition system employing argon gas in a high vacuum chamber (typical base pressures are <1e-7 Torr). Ti can also be formed using CVD of an appropriate Ti containing precursor (for example, $TiCl_4$). Substrate 102 is not limited to merely a silicon substrate, but may be, for example, an oxide or nitride substrate in accordance with a preferred embodiment of the present invention. In FIG. 1B, titanium layer 100 is exposed to $RF_x$ through chemical vapor deposition. $RF_x$ reduces the titanium in titanium layer 100. In place of titanium layer 100 is a layer 104 of compound R, as illustrated in FIG. 1C. R may take the form of various compounds, such as, for example, silicon or tungsten in accordance with a preferred embodiment of the present invention. With silicon being the selected compound for deposition, the fluorine containing compound would be $SiF_4$ and with tungsten, the fluorine containing compound would be $WF_6$. Some other compounds that exist in a gas are:

$AsF_5$—Arsenic penta-F to get arsenic metal $GeF_4$—Germaine to get poly-germanium (semiconductor)

SiF$_4$—Silane to get poly-silicon (semiconductor)

SeF$_6$—Selenium hexa-F to get selenium metal

TeF$_6$—Telerium hexa-F to get telerium metal

WF$_6$—Tungsten hexa-F to get tungsten metal

In particular, the restriction to the type of R group is that the R group must be one that will adhere to substrate 102. Additionally, titanium also must adhere to the selected substrate 102.

Turning now to FIGS. 2A–2F, an example of a process for forming a tungsten plug using tungsten nucleation from WF$_6$ with titanium as the reducing agent is depicted in accordance with a preferred embodiment of the present invention. Chemical vapor deposition is employed in the depicted example in which the application of energy by various forms, such as heat, plasma, or radiation breaks chemical bonds and source materials to associate into free radicals, which in some cases form new compounds and in others a component of the source material deposits out. The component or new compound molecules (WF$_6$) move around on the substrate until they arrive at locations favorable for nucleation. Excess energy is given up and film growth proceeds. The reactions involve pyrolysis in which a compound disassociates with the application of heat and then reduction in which a component of the compound is freed by reacting with another component to form a new compound, with a lower energy. More information on chemical vapor deposition may be found in Anner, *Planar Processing Primer*, Van Nostrand Reinhold, New York, N.Y., (1990) and Wolfe and Tauber, *Silicon Processing for the VLSI Era*, Volume 1: Process Technology, Lattis Press, Sunset Beach, Calif., (1986).

Figure 2A:
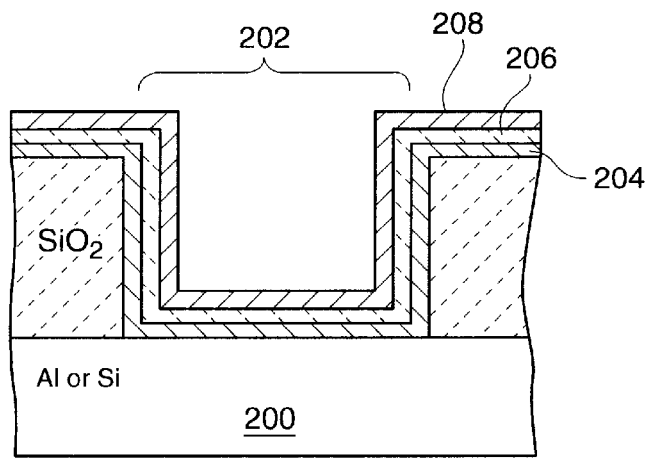
FIGS. 2A–2F is an example of a process for forming a tungsten plug using tungsten nucleation from $WF_6$ with titanium as the reducing agent in accordance with a preferred embodiment of the present invention.
Figure 2B:
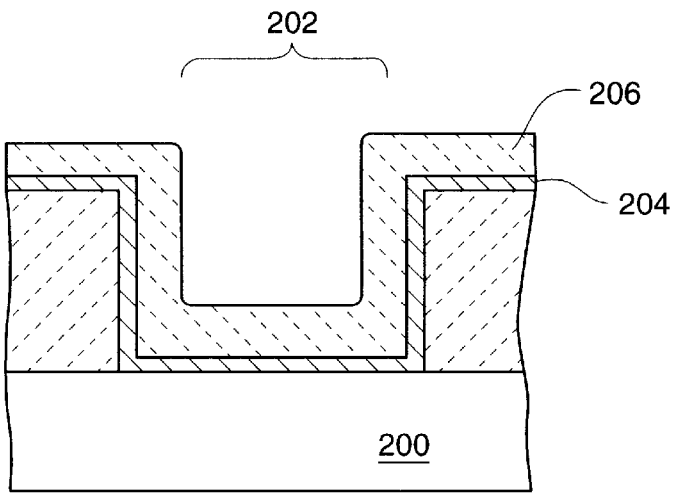
Figure 2C:
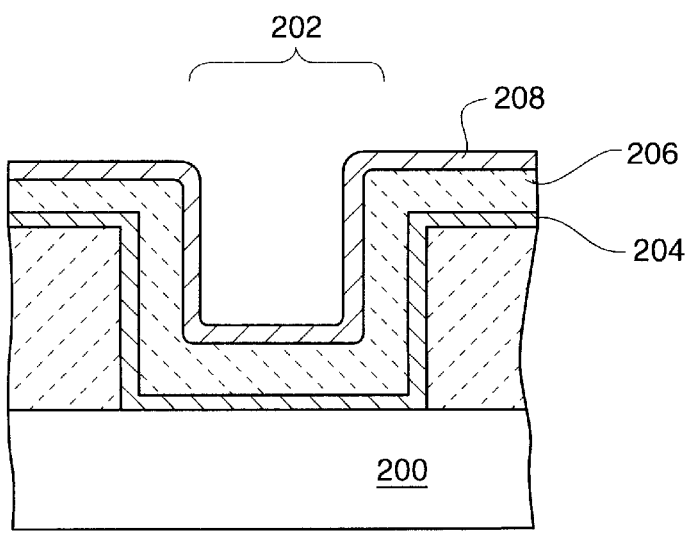
Figure 2D:
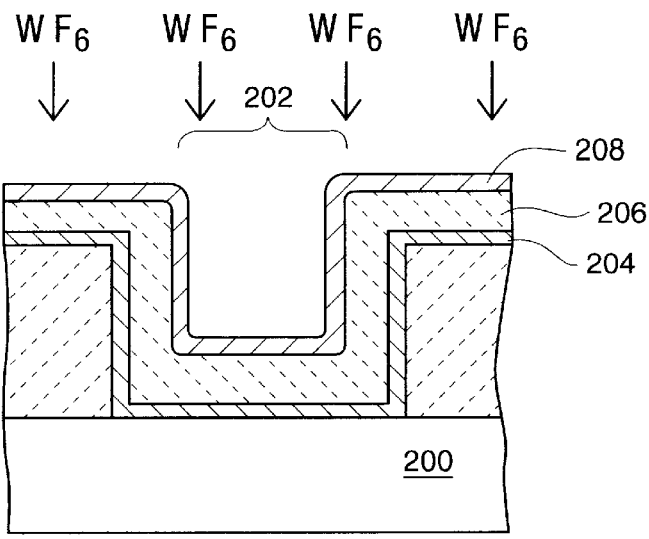
Figure 2E:
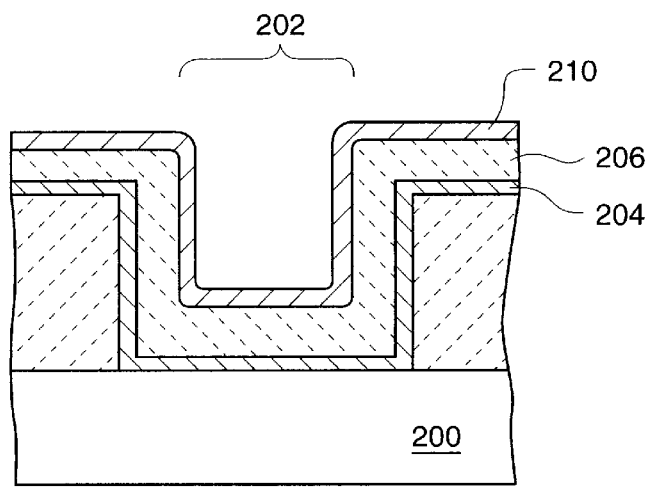
Figure 2F:
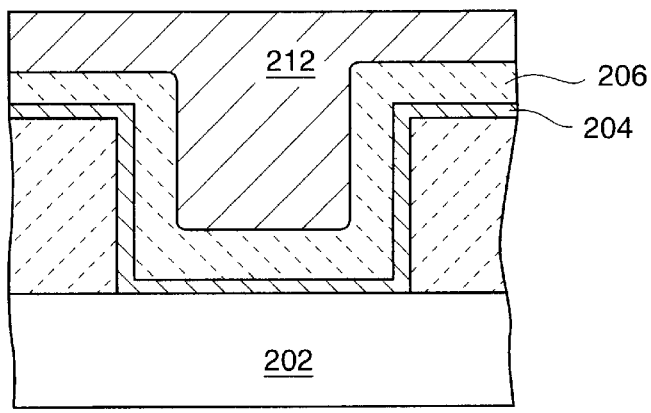

In FIG. 2A, substrate 200 is aluminum or silicon on which an SiO$_2$ insulating layer resides with a hole 202 etched into the SiO$_2$ insulating layer. Additionally, a titanium layer 204 has been deposited by sputtering to a thickness from about 50 Å to about 5000 Å. Next, in FIG. 2B, a titanium nitride (TiN) layer 206 is deposited in a layer from about 50 Å to about 5000 Å thick. Then, a sacrificial titanium layer 208 is deposited, as depicted in FIG. 2C. In the depicted example, sacrificial titanium layer 208 is about 200 Å thick. This layer may vary from about 25 Å to about 200 Å in forming tungsten plugs in vias and contacts having a hole diameter of less than 0.8 μm. Sacrificial titanium layer 208 is employed to promote rapid nucleation of tungsten. Then, in FIG. 2D, sacrificial titanium layer 208 is exposed to WF$_6$ in a CVD reactor, such as a Novelus Systems Concept One Cold-Wall CVD reactor available from Novelus Systems, located in San Jose, Calif. WF$_6$ is flowed through the chamber mixed with argon for reaction with the sacrificial titanium layer 208. The sacrificial titanium layer 208 is reduced and tungsten layer 210 is formed as illustrated in FIG. 2E. In particular, the tungsten components of WF$_6$ is freed by reacting with the titanium in sacrificial titanium layer. The compound formation during WF$_6$ exposures can be expressed by the following reaction:

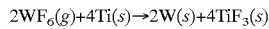

2WF$_6$(g)+4Ti(s)→2W(s)+4TiF$_3$(s)

When a large fraction of sacrificial titanium layer 208 is converted to TiF$_3$, further W$_6$F exposure causes $_4$TiF evolution by fluorination of TiF$_3$ in the reaction shown below:

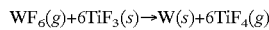

WF$_6$(g)+6TiF$_3$(s)→W(s)+6TiF$_4$(g)

Tungsten deposition on titanium occurs by the reduction of WF$_6$ molecules on the surface of sacrificial titanium layer 208. At higher pressures or longer exposure times, titanium reduction of WF$_6$ can be represented by the following reaction:

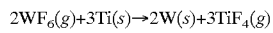

2WF$_6$(g)+3Ti(s)→2W(s)+3TiF$_4$(g)

Thereafter, tungsten plug 212 is formed by further chemical vapor deposition of tungsten using hydrogen gas (H$_2$) as the reducing agent. The use of titanium as a reducing agent for WF$_6$ allows for a significant increase in the nucleation of tungsten. Additionally, nucleated tungsten forms a more effective barrier to prevent diffusion of fluorine into the underlying titanium nitride and titanium layers. Thus, titanium nitride layer 206 and titanium layer 204 are left relatively fluorine free and the likelihood of volcano formation is significantly reduced in such a process.

EXAMPLE

In creating a tungsten plug, a cluster high vacuum physical vapor deposition (PVD) tool may be used in which titanium would be sputtered at a pressure of less than 2 milli torr using argon gas in the vacuum chamber. The titanium layer would be sputtered to a thickness of 600 Å for contacts and 300 Å for vias on a semiconductor device. Then titanium nitride would be sputtered to form a layer that is 700 Å for contacts and 1000 Å for vias. Then a sacrificial titanium layer would be sputtered to form a layer of titanium that is 200 Å thick. Next, the wafer is then placed in a CVD chamber and heated to 445° C. The chamber is then held at 40 torr in a mixture of argon and hydrogen gas. The nucleation step in which the sacrificial titanium layer would be reduced would take place in a mixture of argon, hydrogen gas, and WF$_6$ for 10 or less seconds. The remainder of the nucleation takes place in a mixture of argon, hydrogen, and WF$_6$ from about 15 to about 40 seconds depending on the final tungsten thickness required. The gas ratio used in the two nucleation steps are Ar:H$_2$:WF$_6$=30:30:1.

Thus, the present invention provides an improved process for depositing selected compounds on a substrate. With respect to deposition of tungsten, the present invention provides faster tungsten nucleation and a higher deposition rate for the overall tungsten film, which results in higher throughput for the process. Additionally, lower fluorine content is found in the underlying titanium nitride and the titanium layers. Another benefit of the present invention with respect to deposition of tungsten is smaller tungsten grain size and reduced likelihood of forming volcanos. As a result, more conductive titanium nitride/titanium layers are formed lowering contact and via resistances. This process also may be employed for insulating film deposition on surfaces.

The description of the preferred embodiment of the present invention has been presented for purposes of illustration and description, but is not intended to be exhaustive or limit the invention in the form disclosed. Many modifications and variations will be apparent to those of ordinary skill in the art. For example, although the present invention has been described with reference to a semiconductor process, the method of the present invention also may be applied to other types of processes in other technologies, such as, for example, the surface of fan blades for aircraft or tungsten coatings for tool bits where reduction according to the present invention is employed. The embodiment was chosen and described in order to best explain the principles of the invention and the practical application to enable others of ordinary skill in the art to understand the invention for various embodiments with various modifications as are suited to the particular use contemplated.

What is claimed is:

1. A method in a semiconductor process for forming a layer of a selected reducing agent on a substrate of a semiconductor device:

forming a layer of titanium on the substrate; and reducing the layer of titanium using a gaseous form of a fluorine containing compound, the fluorine containing compound including the selected reducing agent, wherein a layer of the selected reducing agent is formed on the substrate of the semiconductor device.

2. A method in a semiconductor process for forming a layer of a selected reducing agent on a substrate of a semiconductor device:

forming a layer of titanium on the substrate; and reducing the layer of titanium using a gaseous form of a fluorine containing compound, the fluorine containing compound including the selected reducing agent, wherein a layer of the selected reducing agent is formed on the substrate of the semiconductor device wherein the substrate is silicon, wherein the step of forming a layer of titanium on the substrate comprises;

forming a first layer of titanium on the substrate;

forming a titanium nitride layer in contact with the first titanium layer; and forming a second titanium layer in contact with the titanium nitride layer, wherein the second titanium layer is the layer of titanium formed.

3. A method in a semiconductor process for forming a layer of a selected reducing agent on a substrate of a semiconductor device:

forming a layer of titanium on the substrate; and reducing the layer of titanium using a gaseous form of a fluorine containing compound, the fluorine containing compound including the selected reducing agent, wherein a layer of the selected compound is formed on the substrate of the semiconductor device wherein the substrate is oxide and the fluorine containing compound is $SiF_4$ and the selected reducing agent is Si.

4. The method of claim 1, wherein the fluorine containing compound is selected from the group consisting of $AsF_5$, $GeF_4$, $SeF_6$, and $TeF_6$.

5. The method of claim 1, wherein the substrate is selected from the group consisting of silicon and silicon dioxide.

6. The method of claim 1, wherein the layer of titanium is from about 25 Å to about 200 Å thick.

7. The method of claim 1, wherein the reducing step is performed in a chemical vapor deposition reactor.

8. A method of forming a semiconductor device including a tungsten plug comprising:

forming a cavity in a substrate wherein the cavity has a bottom and sidewalls;

forming a first layer of titanium on the bottom and sidewalls of the cavity;

forming a layer of titanium nitride in contact with the first layer of titanium;

forming a second layer of titanium in contact with the layer of titanium nitride; and reducing the second layer of titanium with $WF_6$ in a gaseous form, wherein a layer of tungsten is formed.

9. The method of claim 8, wherein the second layer of titanium is substantially reduced by the $WF_6$.

10. The method of claim 8 further comprising filling the cavity with tungsten after reducing the second layer of titanium.

11. The method of claim 8, wherein the second layer of titanium is about 200 Å thick.

12. The method of claim 8, wherein a first portion of the substrate is silicon and a second portion of the substrate is oxide.

13. The method of claim 8, wherein the second layer of titanium has a thickness from about 25 Å to about 200 Å.

14. The method of claim 8, wherein the layer of titanium nitride has a thickness from about 50 Å to about 5000 Å.

15. The method of claim 8, wherein the first titanium layer has a thickness from about 50 Å to about 5000 Å.

16. The method of claim 8, wherein the step of reducing the second layer is performed in a chemical vapor deposition reactor.

17. A method in a semiconductor process for forming a layer of silicon on an insulator comprising the steps of:

forming a layer of titanium on the insulator; and reducing the layer of titanium using $SiF_4$ in a gaseous form, wherein a layer of polycrystalline or amorphous silicon is formed on the insulator.

18. The method of claim 17, wherein the insulator is oxide.

19. The method of claim 17, wherein the layer of titanium is from about 25 Å to about 200 Å thick.

20. The method of claim 17, wherein the step of forming a layer of titanium on the insulator comprises sputtering titanium onto the insulator.

21. The method of claim 12, wherein the insulator comprises silicon dioxide.

22. The method of claim 8, wherein the step of reducing the second layer of titanium comprises reducing the second layer of titanium with $WF_6$ in a gaseous form and a chemical vapor deposition chamber having a pressure of about 40 torr in a mixture of argon and hydrogen gas.

23. The method of claim 22, wherein the argon gas, hydrogen gas, and $WF_6$ in gaseous form have a ratio of 30:30:1.

24. The method of claim 22, wherein the step of reducing the second layer of titanium with $WF_6$ in a gaseous form comprises reducing the second layer of titanium with $WF_6$ in a gaseous form in a chemical vapor deposition chamber heated to about 445° C.

25. A method in a semiconductor process for forming a layer of a selected reducing agent on a semiconductor device comprising:

forming a layer of a nucleating compound, wherein the nucleating compound forms a fluorine gas biproduct in response to exposure to a fluorine containing compound in a gaseous form, wherein the fluorine containing compound includes the selected reducing agent; and exposing the layer to the fluorine containing compound in a gaseous form, wherein nucleation of the nucleating compound in the layer occurs forming the layer of the selected reducing agent, wherein the layer of the selected reducing agent is formed on the semiconductor device, replacing the layer of the nucleating compound.

26. The method of claim 25, wherein the layer of nucleating compound is a layer of titanium.

27. The method of claim 26, wherein the fluorine containing compound in gaseous form is $WF_6$.

28. A method in a semiconductor process for forming a layer of a selected reducing agent on a semiconductor device comprising:

forming a layer of a nucleating compound, wherein the nucleating compound forms a fluorine gas biproduct in response to exposure to a fluorine containing compound in a gaseous form, wherein the fluorine containing compound includes the selected reducing agent; and exposing the layer to the fluorine containing compound in a gaseous form, wherein nucleation of the nucleating compound in the layer occurs forming the layer of the selected reducing agent, wherein the layer of nucleating compound is a layer of titanium and wherein the fluorine containing compound in gaseous form is $SiF_4$ and the selected reducing agent is Si.

29. The method of claim 26, wherein the fluorine containing compound is selected from the group consisting of $AsF_5$, $GeF_4$, $SeF_6$, and $TeF_6$.

* * * * *